United States Patent
Ku

(10) Patent No.: US 7,842,953 B2
(45) Date of Patent: Nov. 30, 2010

(54) PIXEL STRUCTURE AND REPAIRING METHOD THEREOF

(75) Inventor: Hui-Ling Ku, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 473 days.

(21) Appl. No.: 12/046,441

(22) Filed: Mar. 11, 2008

(65) Prior Publication Data

US 2009/0152552 A1 Jun. 18, 2009

(30) Foreign Application Priority Data

Dec. 13, 2007 (TW) .............................. 96147670 A

(51) Int. Cl.
*H01L 31/20* (2006.01)

(52) U.S. Cl. .................. 257/59; 257/72; 257/E27.121; 257/E21.526; 438/4; 438/34

(58) Field of Classification Search .................. 257/59, 257/72, E27.121, E21.526; 438/4, 34
See application file for complete search history.

(56) References Cited

U.S. PATENT DOCUMENTS

| 5,691,786 | A | 11/1997 | Nakai |
| 6,403,980 | B1 | 6/2002 | Park |
| 6,441,401 | B1 | 8/2002 | Jung et al. |
| 6,573,532 | B2 | 6/2003 | Park |
| 6,628,368 | B2 | 9/2003 | Yang |
| 6,657,231 | B2 | 12/2003 | Jung et al. |
| 6,809,335 | B2 | 10/2004 | Park |
| 7,304,692 | B2 * | 12/2007 | Shiau et al. ................... 349/54 |

FOREIGN PATENT DOCUMENTS

JP 09-222615 8/1997

\* cited by examiner

*Primary Examiner*—Tu-Tu V Ho
(74) *Attorney, Agent, or Firm*—Jianq Chyun IP Office

(57) ABSTRACT

A pixel structure disposed on a substrate and including a common line, a reserved line, a dielectric layer, two repair lines, an active device, and a pixel electrode is provided. The reserved line and the common line are disposed on the substrate and are covered by the dielectric layer. The repair lines are disposed on the dielectric layer, and each repair line has a first repairing region overlapped with the common line and a second repairing region overlapped with the reserved line. When the common line is open, the repair lines in the first and second repairing regions are connected with the common line and the reserved line, such that the common line, the repair lines, and the reserved line are electrically connected. After the common line, the repair lines, and the reserved line are connected, the above-mentioned pixel structure is effectively repaired.

23 Claims, 23 Drawing Sheets

PIXEL STRUCTURE AND REPAIRING METHOD THEREOF

CROSS-REFERENCE TO RELATED APPLICATION

This application claims the priority benefit of Taiwan application serial no. 96147670, filed on Dec. 13, 2007. The entirety the above-mentioned patent application is hereby incorporated by reference herein and made a part of specification.

BACKGROUND OF THE INVENTION

1. Field of the Invention

The present invention relates to a pixel structure and a repairing method thereof, and more particularly, to a pixel structure capable of being repaired easily and a repairing method thereof.

2. Description of Related Art

Thin film transistor liquid crystal displays (TFT-LCDs) having superior characteristics such as high definition, good space utilization, low power-consumption, and no radiation have become a mainstream product of displays. A common TFT-LCD is mainly constituted by a TFT array substrate, an opposite substrate, and a liquid crystal layer sandwiched between the opposite substrate. The TFT array substrate mainly includes a substrate, scan lines, data lines, and pixel structures arranged in an array on the substrate. The pixel structure is mainly constituted by a TFT, a pixel electrode, and a storage capacitor (Cst). Generally speaking, a scan signal transmitted by the scan line may turn on the corresponding TFT, and meanwhile, an image signal transmitted by the data line is transmitted to the corresponding pixel electrode through the TFT, such that the pixel electrode is able to control the liquid crystals there above, thereby achieving the purpose of display.

FIG. 1A is a schematic view of a conventional pixel structure, and FIGS. 1B and 1C are schematic cross-sectional views taken along a line a-b and a line c-d in FIG. 1A, respectively. Referring to FIGS. 1A and 1B, a conventional pixel structure 101 is disposed on a substrate 100 and is electrically connected with a scan line 102 and a data line 104. The pixel structure 101 includes a TFT 106, a common line 108, and a pixel electrode 110. The TFT 106 includes a gate 106a, a channel layer 106c, a source 106s, and a drain 106d. As shown in FIGS. 1A and 1B, the gate 106a of the TFT 106 is electrically connected with the scan line 102, the source 106s is electrically connected with the data line 104, the drain 106d is electrically connected with the pixel electrode 110 through the contact opening 112, thereby receiving the image signal transmitted by the data line 104. The common line 108 and the pixel electrode 110 form the storage capacitor Cst. FIG. 1C is a cross-sectional view of the storage capacitor. The common line 108 serves as a lower electrode of the storage capacitor Cst, and the pixel electrode 110 serves as an upper electrode of the storage capacitor Cst and is electrically insulated from the common line 108 through a dielectric layer 114 and a passivation layer 116, and thus the storage capacitor Cst enables the pixel structure 101 to maintain a good display quality.

In fabrication, the common line 108 of the pixel structure 101 is often open due to the particles or other factors, thereby causing abnormal display of the pixel, and generating defects on the LCD. In order to improve the grade of the display, the defects must be repaired. However, the conventional pixel structure 101 is not easy to be repaired, and thus the yield rate of the display cannot be effectively improved.

SUMMARY OF THE INVENTION

Accordingly, the present invention is directed to a pixel structure having a reserved line and a repair line.

The present invention is directed to a method of fabricating the pixel structure.

The present invention is directed to a method capable of repairing an open common line through connection to enable the pixel structure to display normally.

The present invention is further directed to a method, which separates the pixel electrode into a plurality of blocks and repairs an open common line through connection to enable the pixel structure to display normally.

The present invention provides a pixel structure disposed on a substrate and electrically connected with a scan line and a data line. The pixel structure includes a common line, a reserved line, a dielectric layer, two repair lines, an active device, and a pixel electrode. The reserved line and the common line are disposed on the substrate, electrically insulated from each other, and covered by the dielectric layer. The repair lines are disposed on the dielectric layer, and each repair line has a first repairing region overlapped with the common line and a second repairing region overlapped with the reserved line. The active device is disposed on the substrate, and electrically connected with the scan line and the data line. In addition, the pixel structure is disposed above the dielectric layer, and electrically connected with the active device.

The present invention provides a method, for repairing the above-mentioned pixel structure. When the common line is open, the repairing method includes in the first repairing regions and the second repairing regions respectively connecting the repair lines with the common line and the reserved line.

The present invention further provides a method, for repairing the above-mentioned pixel structure. When the common line is open, the method includes separating the pixel electrode into two first blocks and a second block electrically insulated from the first blocks. Then, the first blocks, the repair lines in the first repairing regions, and the common line are connected, and the first blocks, the repair lines in the second repairing regions, and the reserved line are connected.

The present invention provides a method of fabricating a pixel structure. First, a gate, a scan line, a common line, and a reserved line are formed on a substrate, in which the gate is electrically connected with the scan line. A dielectric layer is formed on the substrate, and the dielectric layer covers the gate, the scan line, the common line, and the reserved line. A channel layer is formed on the dielectric layer. A source, a drain, a data line, and two repair lines are formed on the dielectric layer, in which the source and the drain cover a portion of the channel layer above two sides of the gate, and the source is electrically connected with the data line. The gate, the channel layer, the source, and the drain constitute an active device. Each repair line has a first repairing region overlapped with the common line and a second repairing region overlapped with the reserved line. Thereafter, a pixel electrode is formed on the substrate, and the pixel electrode is electrically connected with the drain.

The present invention provides a display panel including the above-mentioned pixel structure.

The present invention provides an electro-optical apparatus including the above-mentioned display panel.

The present invention provides a method of fabricating a display panel, including the above-mentioned method of fabricating a pixel structure.

The present invention provides a method of fabricating an electro-optical apparatus, including the above-mentioned method of fabricating a display panel.

The present invention provides a method of repairing a display panel, including the above-mentioned method of repairing a pixel structure.

The present invention provides a method of repairing an electro-optical apparatus, including the above-mentioned method of repairing a display panel.

In the embodiments of the present invention, the pixel structure has the reserved line and the repair line, and the common line, the repair lines, and the reserved line are connected through connection when the common line is open. At this time, the pixel structure is repaired and maintains normal display. Therefore, the yield rate of the display is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
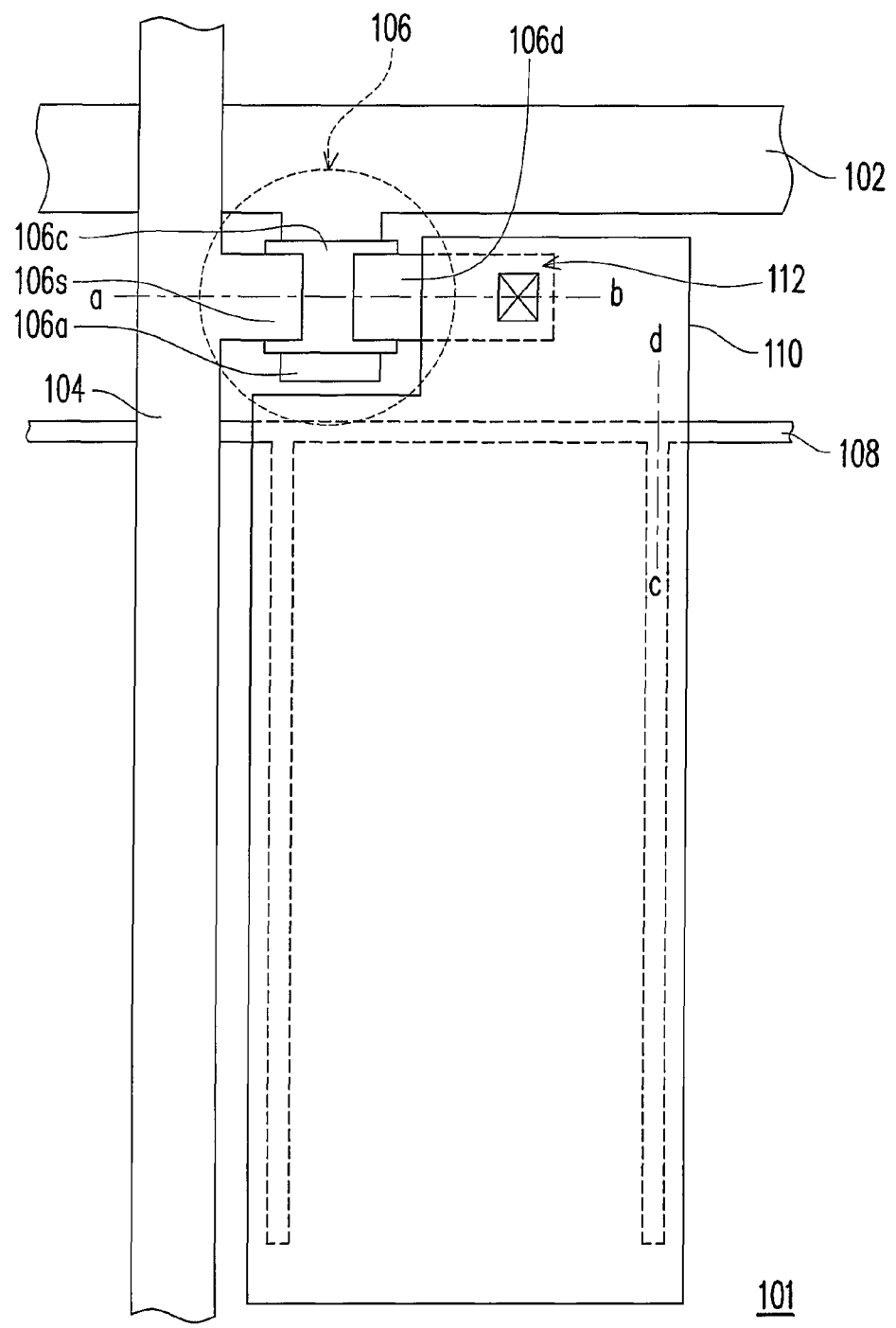
FIG. 1A is a schematic view of a conventional pixel structure.
Figure 1B:
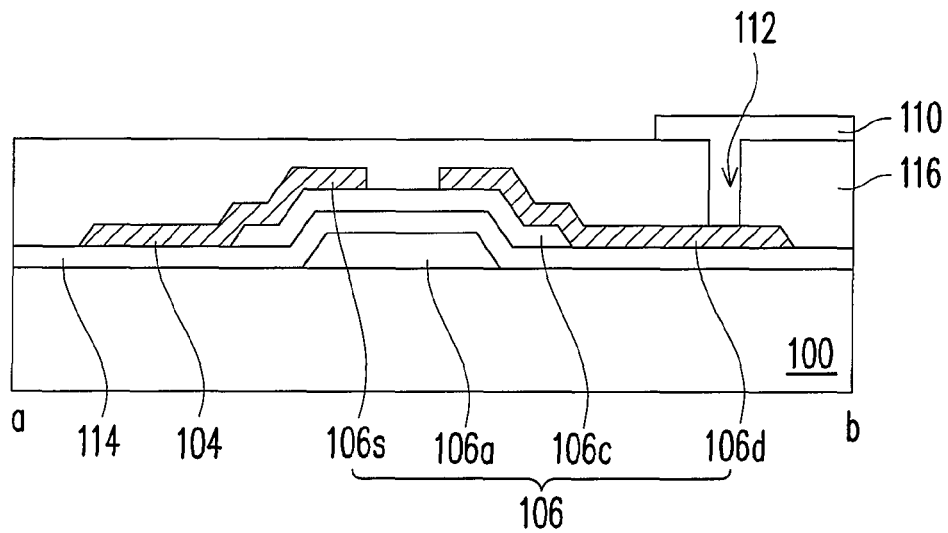
FIG. 1B is a schematic cross-sectional view taken along a line a-b in FIG. 1A.
Figure 1C:
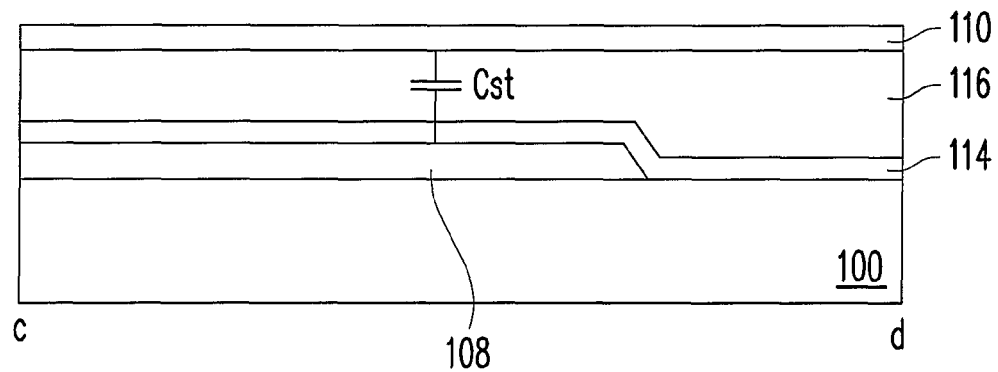
FIG. 1C is a schematic cross-sectional view taken along a line c-d in FIG. 1A.

Reference will now be made in detail to the present embodiments of the invention, examples of which are illustrated in the accompanying drawings. Wherever possible, the same reference numbers are used in the drawings and the description to refer to the same or like parts.

The First Embodiment

FIG. 2A to 2F are schematic top views of a method of fabricating a pixel structure according to a first embodiment of the present invention, and FIG. 3A to 3F and FIG. 4A to 4F are schematic cross-sectional views taken along a line a-b and a line c-d in FIG. 2A to 2F, respectively.

Figure 2A:
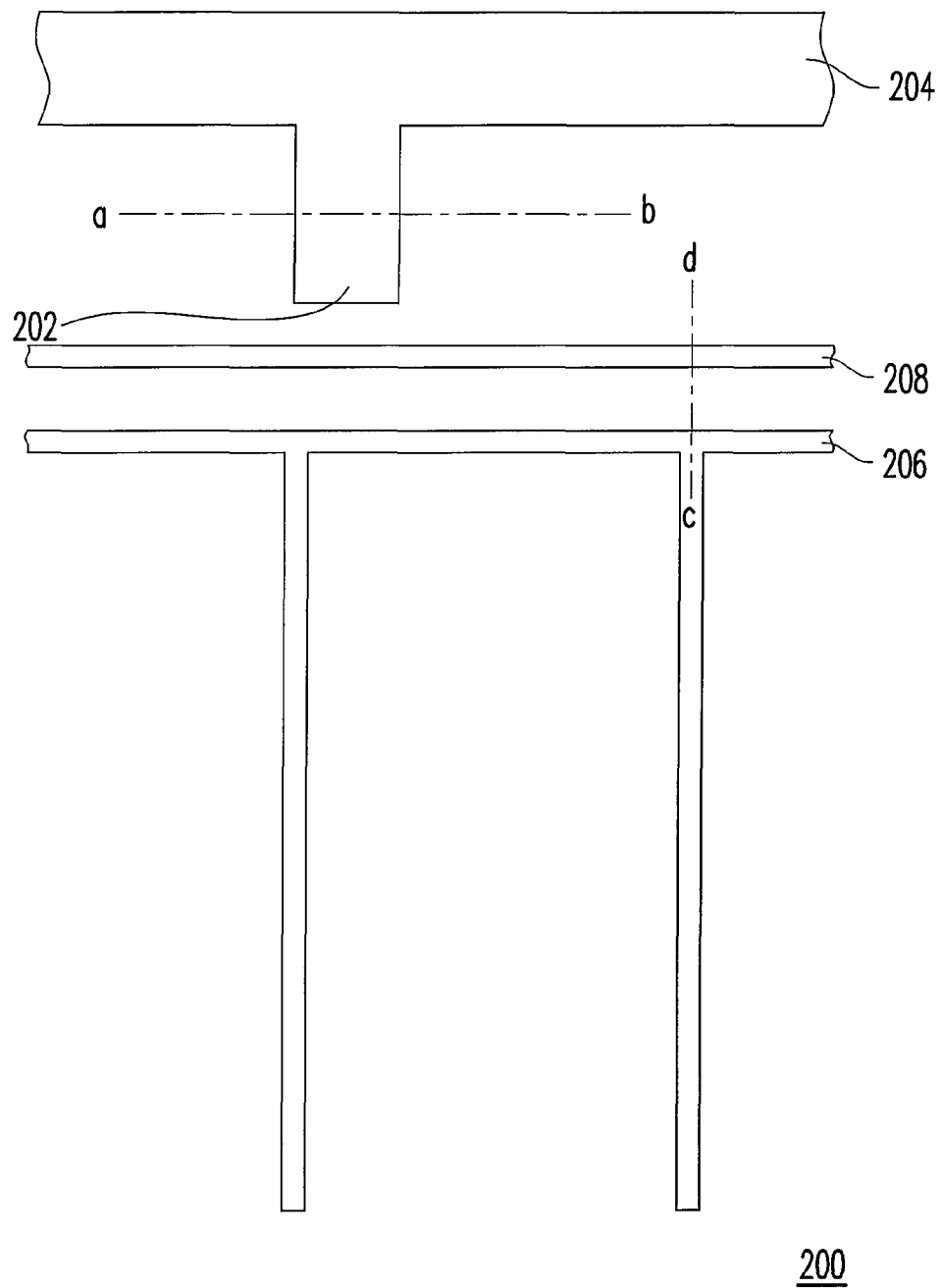
FIG. 2A to 2F are schematic top views of processes of a method of fabricating a pixel structure according to a first embodiment of the present invention.
Figure 3A:
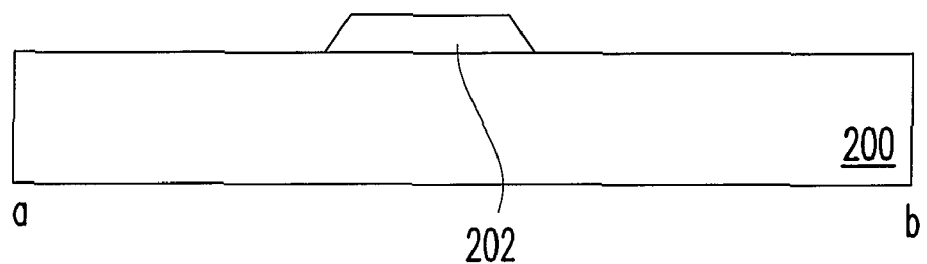
FIG. 3A to 3F are schematic cross-sectional views taken along a line a-b in FIG. 2A to 2F.
Figure 4A:
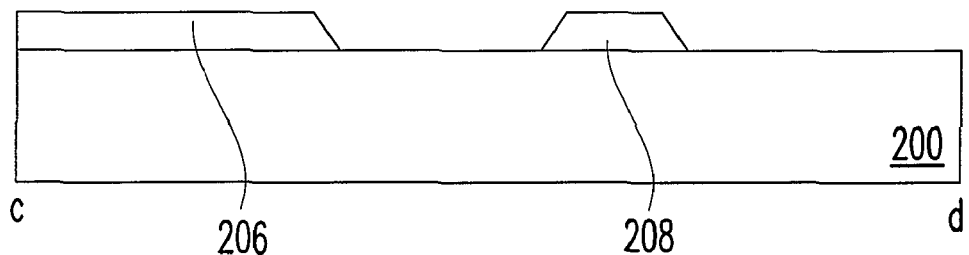
FIG. 4A to 4F are schematic cross-sectional views taken along a line c-d in FIG. 2A to 2F.

Referring to FIGS. 2A, 3A, and 4A, a first patterned conductive layer (not marked) including a gate 202, a scan line 204, a common line 206, and a reserved line 208 is formed on a substrate 200. The material of the substrate 200 is, for example, an inorganic transparent material, an organic transparent material, an inorganic opaque material, or a combination thereof. The inorganic transparent material is, for example, glass, quartz, or another suitable material. The organic transparent material is, for example, polyalkenes, polythiols, polyalcohols, polyesters, rubber, thermoplastic polymers, thermosetting polymers, polyarylenes, polymethyl methacrylates, polycarbonates, other suitable materials, derivatives or combinations thereof. The inorganic opaque material is, for example, silica sheet, ceramic, another suitable material, or a combination thereof. In this embodiment, the material of the substrate 200 is, for example, but not limited to, glass. The gate 202, the scan line 204, the common line 206, and the reserved line 208 may be a single-layered structure or a multi-layered structure, and the material of at least one of the gate 202, the scan line 204, the common line 206, and the reserved line 208 is, for example, gold, silver, copper, tin, aluminium, lead, titanium, molybdenum, neodymium, tungsten, niobium, hafnium, chromium, tantalum, other metal materials, or nitrides, oxides, and alloys of the above metals, and/or combinations thereof. Further, the common line 206 and the reserved line 208 are electrically insulated from each other. In this embodiment, the common line 206 is, for example, substantially in a π shape viewing from the top. Moreover, in this embodiment, the reserved line 208 is, for example, but not limited to be, disposed between the common line 206 and the scan line 204. It should be noted that in other embodiments, the common line 206 may be substantially in a bar shape, L shape, H shape, C shape, E shape, F shape, T shape, or O shape, or another shape, or combinations thereof viewing from the top.

Figure 2B:
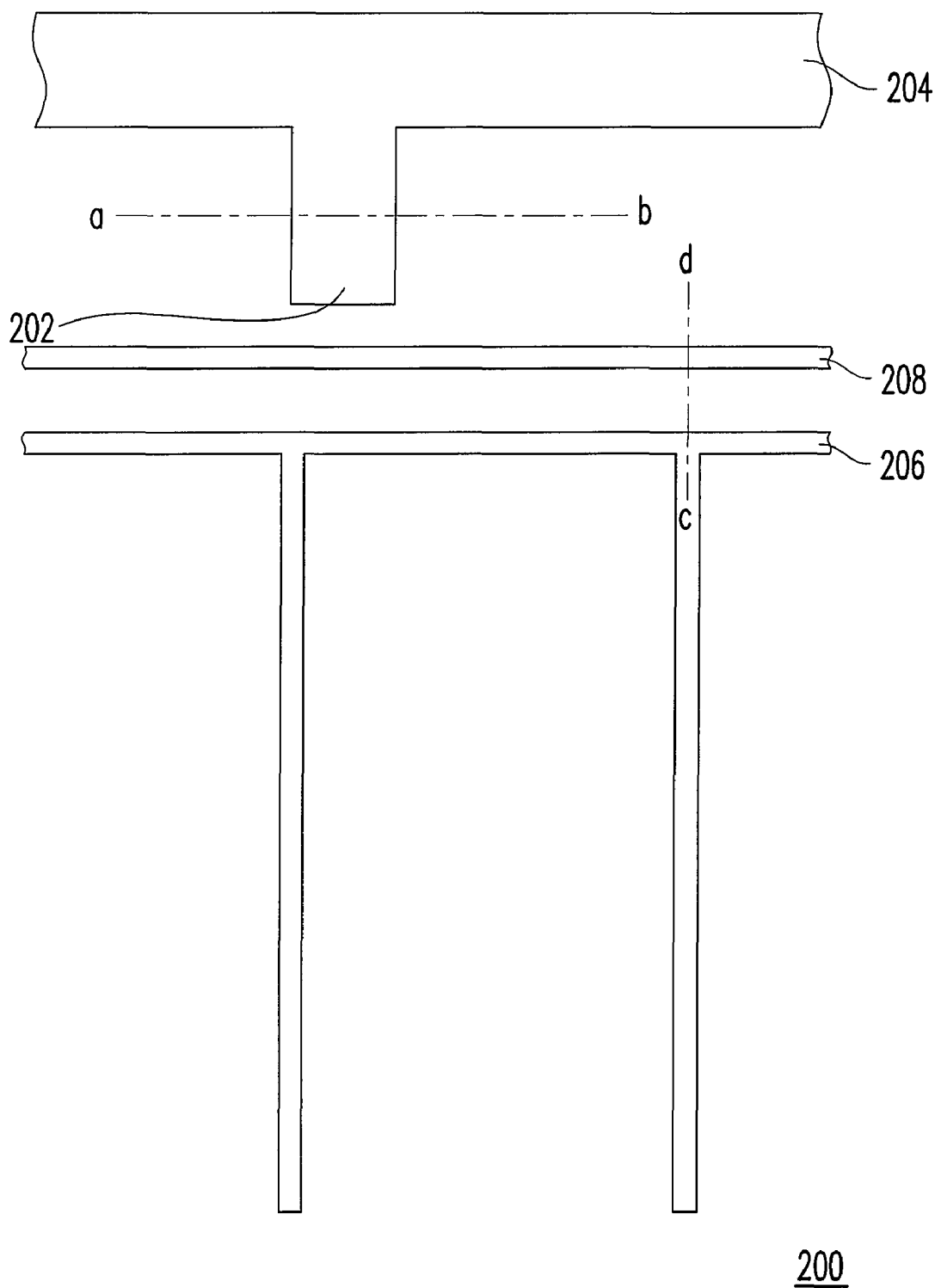
Figure 3B:
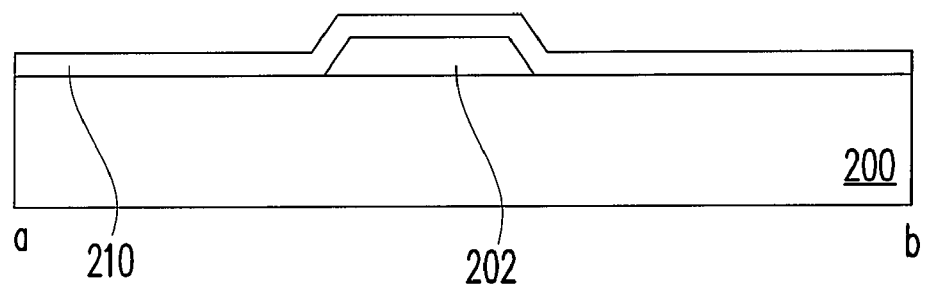
Figure 4B:
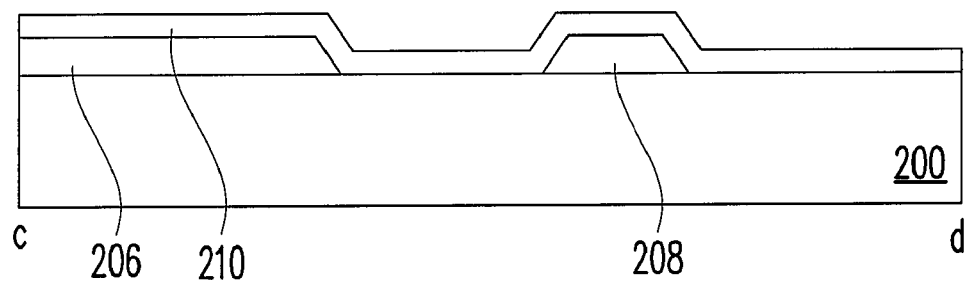

Referring to FIGS. 2B, 3B, and 4B, a dielectric layer 210 is formed on the substrate 200. The dielectric layer 210 covers the gate 202, the scan line 204, the common line 206, and the reserved line 208. The dielectric layer 210 may be a single-layered structure or a multi-layered structure, and the material thereof is, for example, an inorganic material, an organic material, or a combination thereof. The inorganic material is, for example, silica, silicon nitride, silicon oxynitride, another suitable material, or a combination thereof. The organic material is, for example, photoresist, polyarylene ether (PAE), polyarylenes, polyesters, polyalcohols, polyalkenes, benzocyclclobutene (BCB), HSQ (hydrogen silsesquioxane), MSQ (methyl silesquioxane), SiOC—H, polyethers, polyketones, polyaldehydes, polyphenols, polynaphthenes, polyoxyalkylenes, polyynes, polyphenol-aldehydes, other suitable materials, or combinations thereof. In this embodiment, the dielectric layer 210 is, for example, but not limited to, a single-layered structure, and the material thereof is silicon nitride.

Figure 2C:
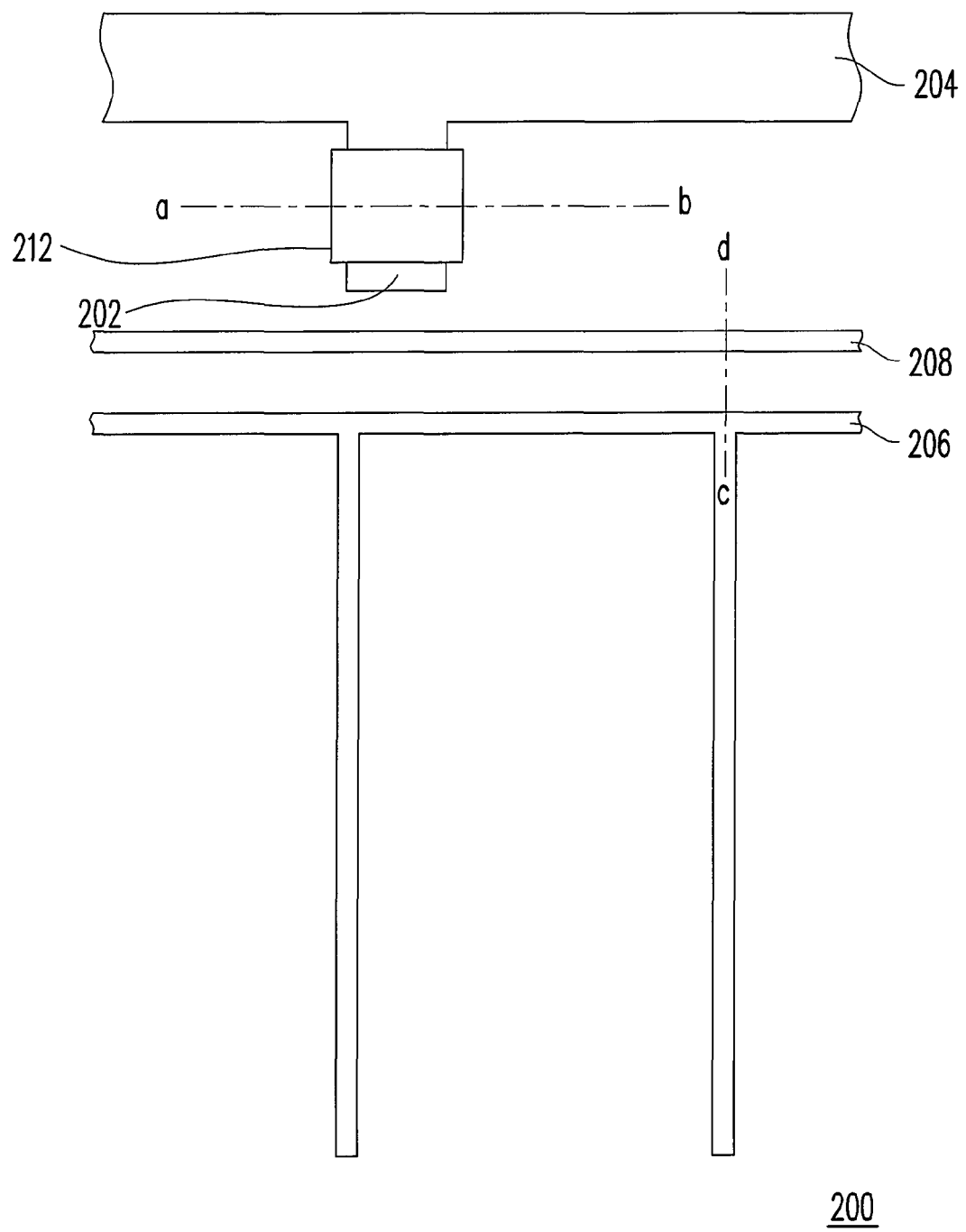
Figure 3C:
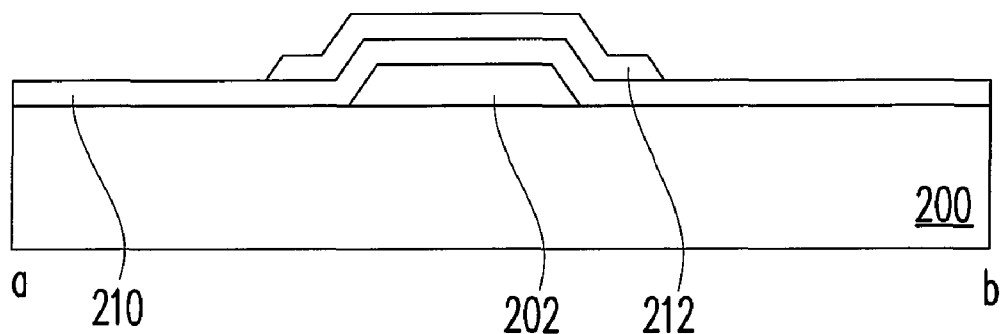
Figure 4C:
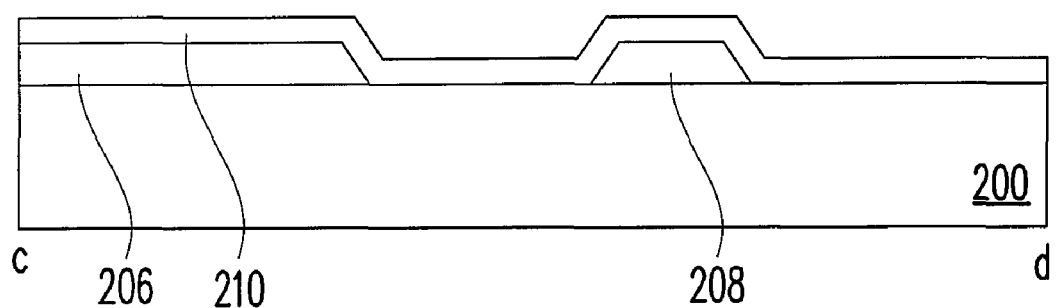

Referring to FIGS. 2C, 3C, and 4C, a channel layer 212 is formed on the dielectric layer 210 above the gate 202. The channel layer 212 may be a single-layered structure or a multi-layered structure, and the material thereof is, for example, amorphous silicon, polysilicon, microcrystalline silicon, monocrystalline silicon, germanium containing silicon, another suitable material, or a combination thereof. Moreover, the single-layered structure or multi-layered structure of the channel layer 212 may include at least one of a heavily-doped region, a lightly-doped region, and an undoped region. In this embodiment, the material of the channel layer 212 is, for example, but not limited to, amorphous silicon.

Figure 2D:
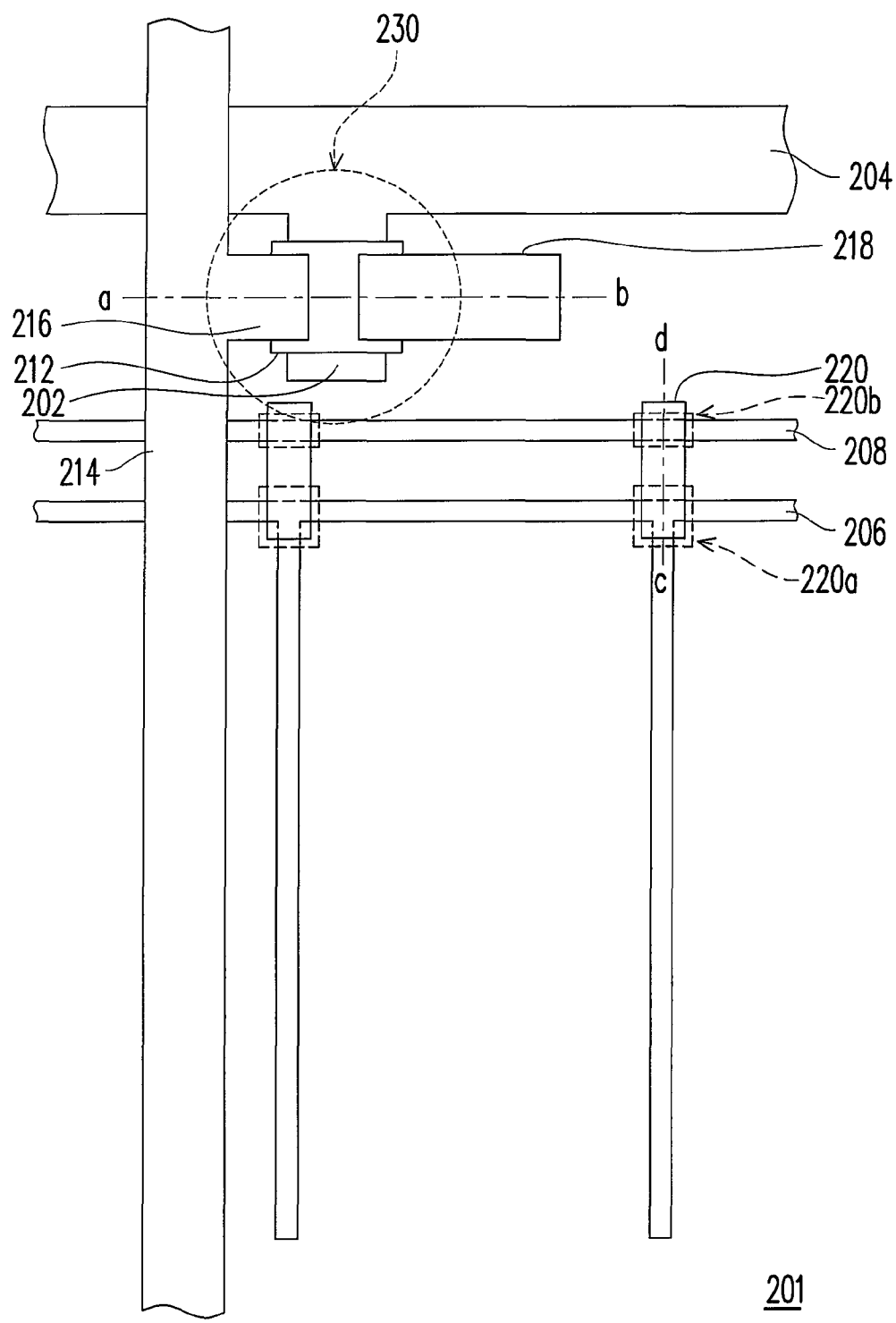
Figure 3D:
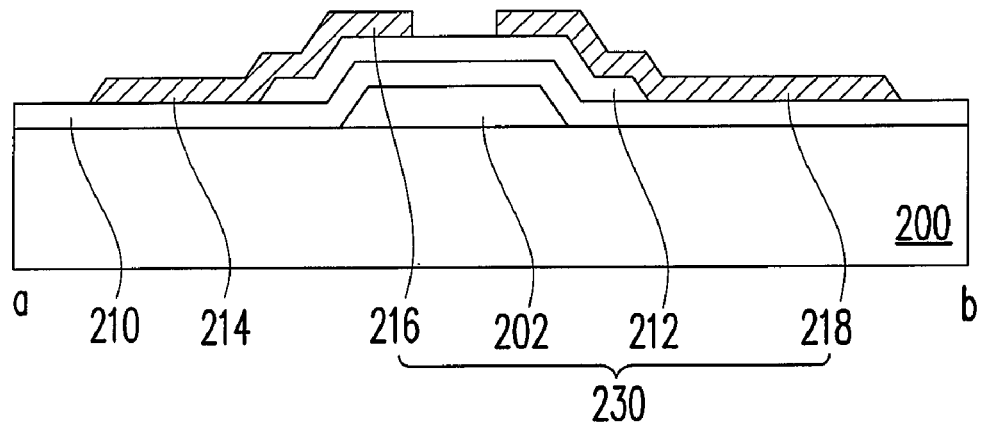
Figure 4D:
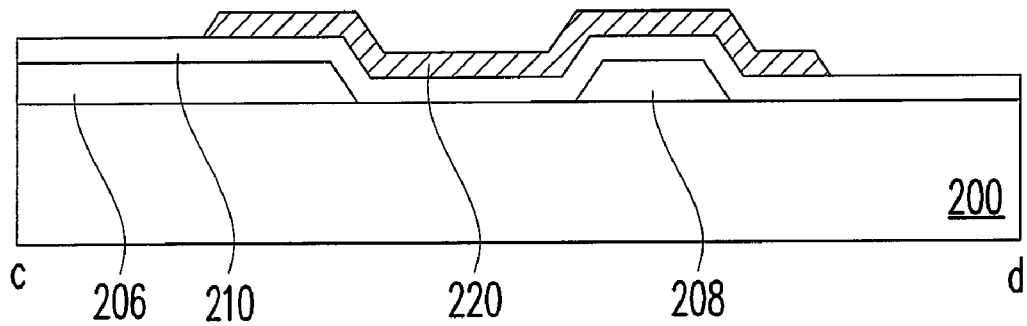

Referring to FIGS. 2D, 3D, and 4D, a second patterned conductive layer (not shown) including a source 216, a drain 218, a data line 214, and a repair line 220 is formed on the dielectric layer 210. The repair line 220 has a first repairing region 220a overlapped with the common line 206 and a second repairing region 220b overlapped with the reserved line 208, and the first repairing region 220a and the second repairing region 220b respectively have at least one connection point (not shown) for being connected with the common line 206 and the reserved line 208. The source 216, the drain 218, the data line 214, and the repair line 220 may be a single-layered structure or a multi-layered structure. The material of at least one of the source 216, the drain 218, the data line 214, and the repair line 220 is, for example, gold, silver, copper, tin, aluminium, lead, titanium, molybdenum, neodymium, tungsten, niobium, hafnium, chromium, tantalum, another metal material, nitrides thereof, oxides thereof, alloys thereof, or combinations thereof. It should be noted that any two of the source 216, the drain 218, the data line 214, and the repair line 220 have the same or different structures or materials. Further, the gate 202, the channel layer 212, the source 216, and the drain 218 as an active device 230, and the gate 202 of the active device 230 is electrically connected with the scan line 204, and the source 216 is electrically connected with the data line 214.

Figure 2E:
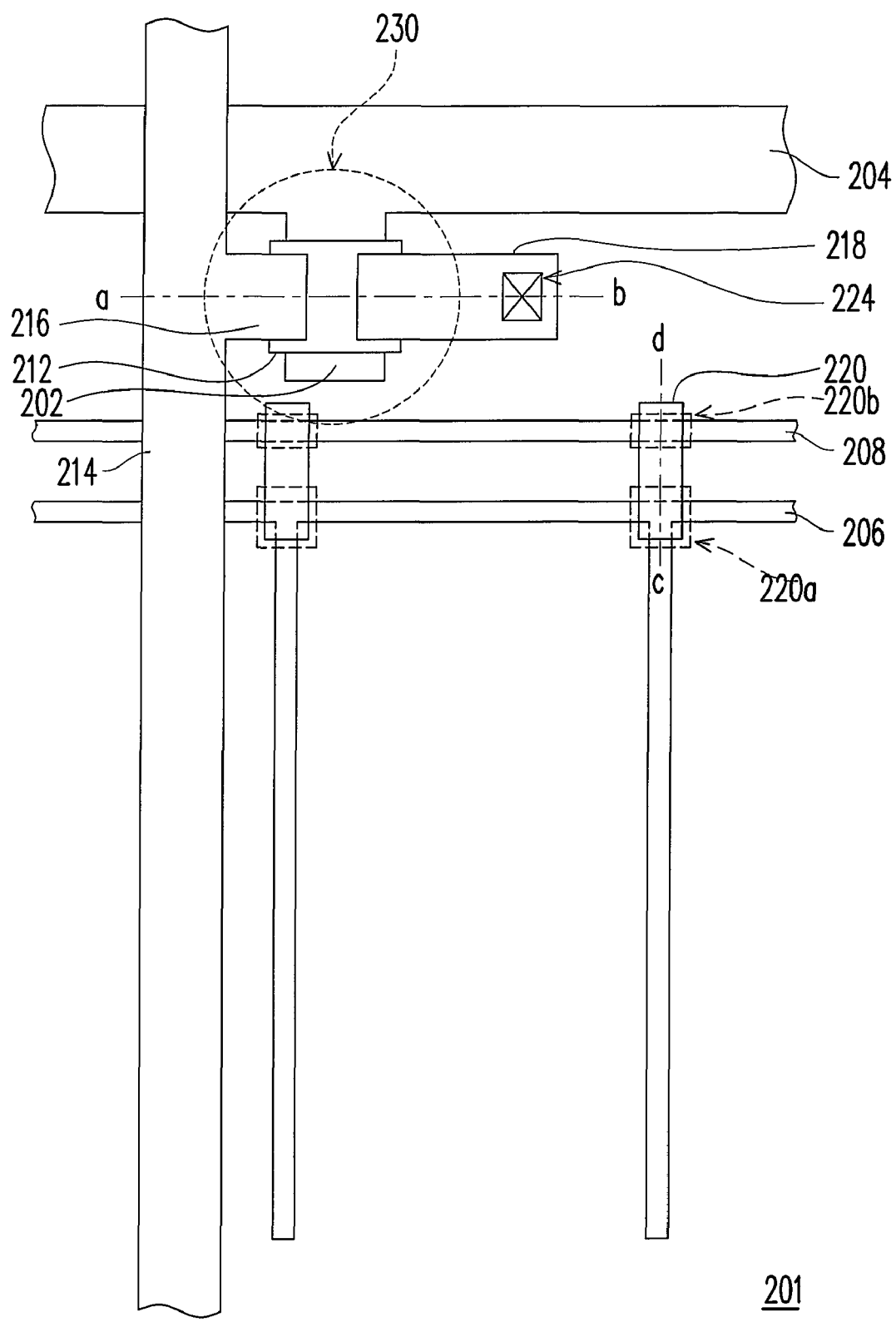
Figure 3E:
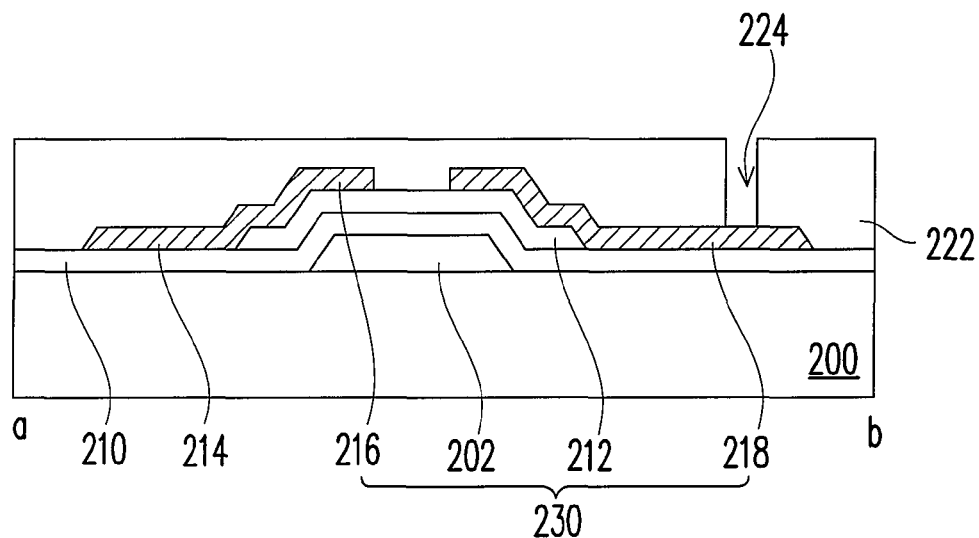
Figure 4E:
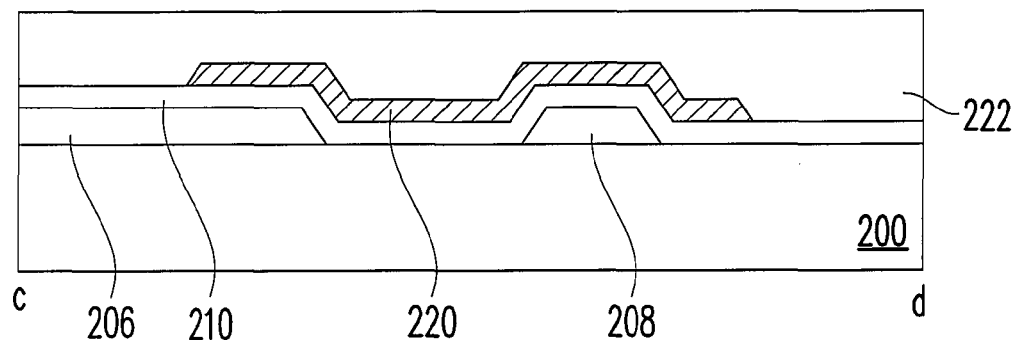

Referring to FIGS. 2E, 3E, and 4E, a passivation layer 222 is formed on the substrate 200. The passivation layer 222 covers the scan line 204, the data line 214, the active device 230, the common line 206, the reserved line 208, the dielectric layer 210, and the repair line 220. Thereafter, a contact opening 224 is, for example, formed in the passivation layer 222.

Figure 2F:
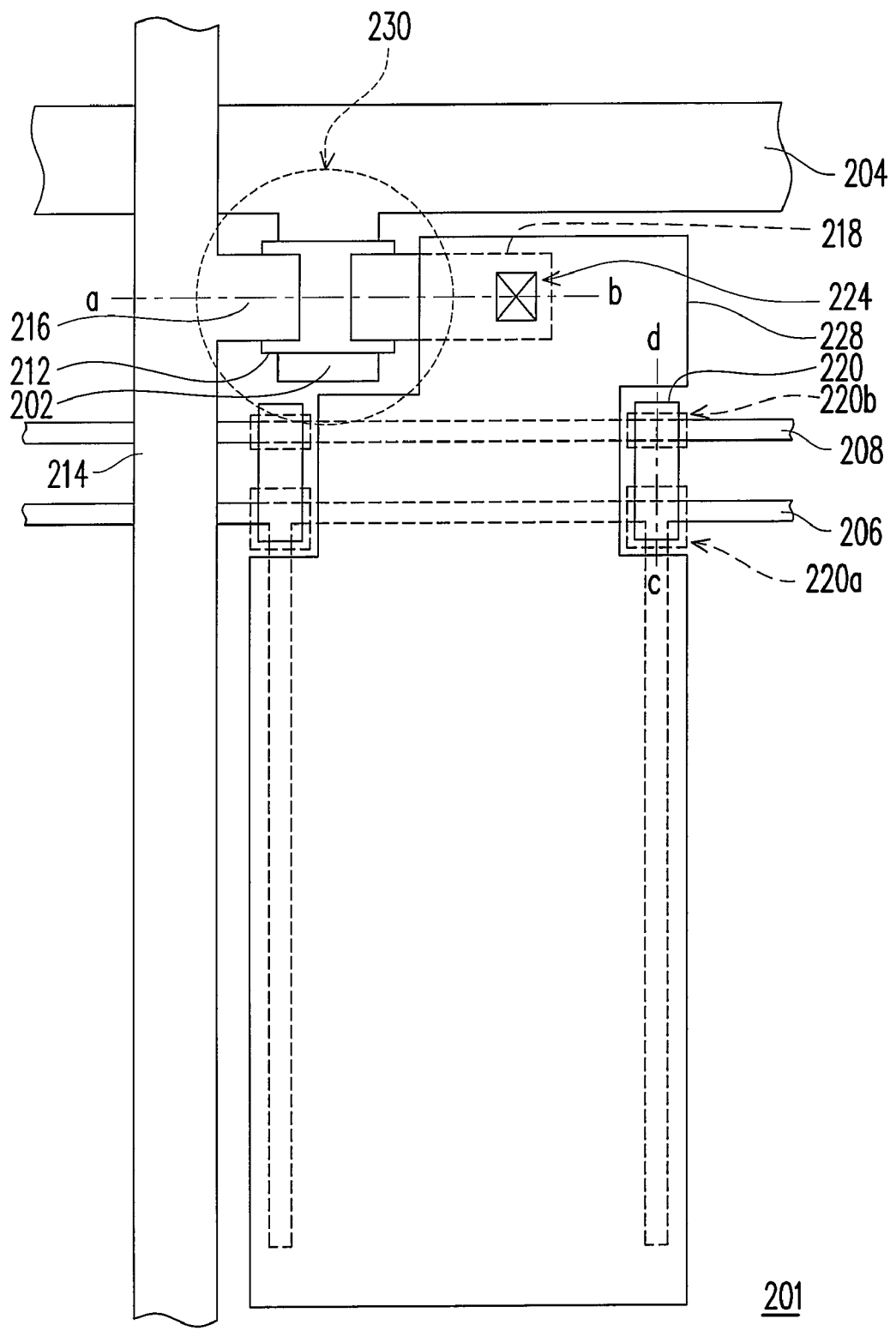
Figure 3F:
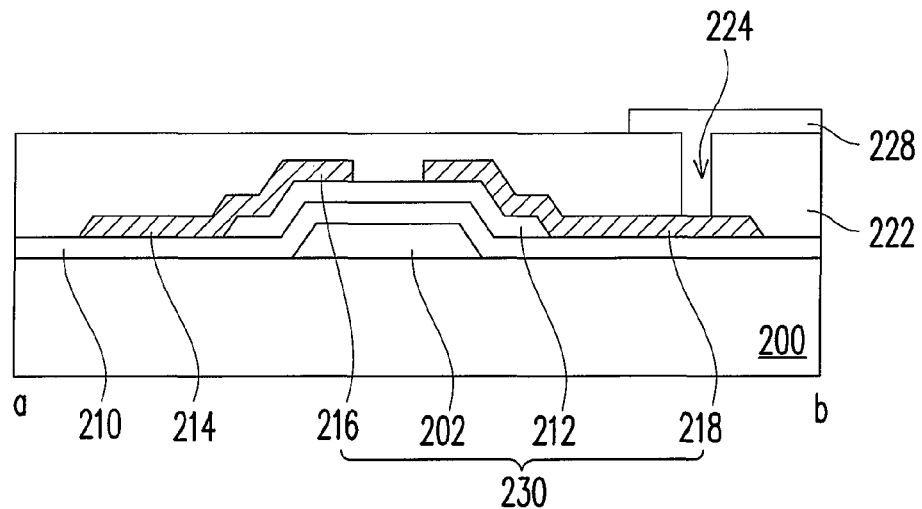
Figure 4F:
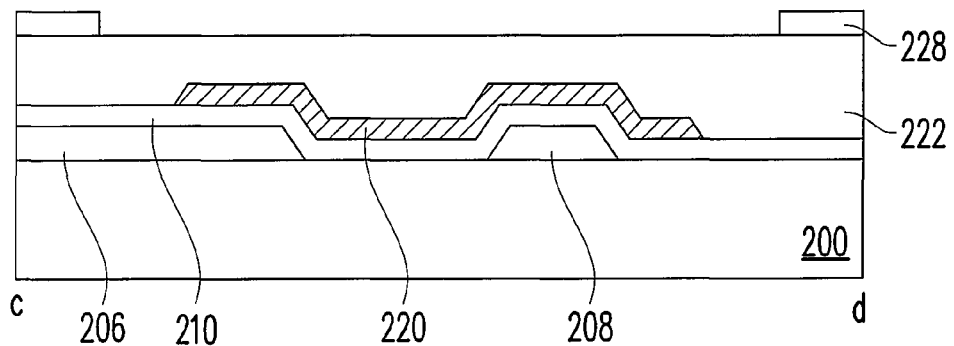

Referring to FIGS. 2F, 3F, and 4F, a pixel electrode 228 is formed on the passivation layer 222, thereby accomplishing the fabrication of a pixel structure 201. The pixel electrode 228 is electrically connected with the active device 230 through the contact opening 224. Specifically, the pixel electrode 228 is electrically connected with the drain 218 of the active device 230 through the contact opening 224. The pixel electrode 228 may be a single-layered structure or a multi-layered structure, and the material thereof is, for example, an opaque material, a transparent material, or a combination thereof. The opaque material is, for example, gold, silver, copper, tin, aluminium, lead, titanium, molybdenum, neodymium, tungsten, niobium, hafnium, chromium, tantalum, another metal material, or nitrides, oxides, and alloys of the above metals, and/or combinations thereof. The transparent material is, for example, indium tin oxide, indium zinc oxide, indium tin zinc oxide, hafnium oxide, zinc oxide, aluminium oxide, aluminium tin oxide, aluminium zinc oxide, cadmium tin oxide, cadmium zinc oxide, or a combination thereof. In this embodiment, the material of the pixel electrode 228 is, for example, but not limited to, indium tin oxide (ITO). It should be noted that in this embodiment, the pixel electrode 228 is disposed without covering the first repairing region 220a and the second repairing region 220b, so as to facilitate the subsequent repairing procedure. Further, in this embodiment, the pixel electrode 228 is, for example, but not limited to, formed on the passivation layer 222. The pixel electrode 228 may also be formed on the dielectric layer 210, so as to be electrically connected with the active device 230. In brief, the passivation layer 222 is not included in the structure.

Moreover, in this embodiment, the active device 230 is a bottom-gate type back channel etching TFT. In other embodiments, the active device 230 is a bottom-gate type TFT including etching stop layer or namely etching stop type TFT, a top-gate type TFT, or transistor of other types. Further, the shapes of the source 216 and the drain 218 in the active device 230 are substantially asymmetric or substantially symmetric viewing from the top. In addition, the gate 202 is located in the scan line 204, i.e., a portion of the scan line 204 serves as the gate 202.

Furthermore, in the fabrication of the pixel structure 201, a plurality of patterning processes are performed, so as to form the devices such as a first patterned conductive layer (not shown), a second patterned conductive layer (not shown), the channel layer 212, the passivation layer 222, and the pixel electrode 228. In this embodiment, the patterning processes include steps of depositing, exposing, developing, and etching. However, in other embodiments, the patterning process includes screen printing, ink-jet printing, depositing, exposing, developing, laser ablation, another suitable manner, or a combination thereof. Further, in this embodiment, a common mask having a light-transmissive region and a light-shielding region is used to perform the patterning. However, in other embodiments, a mask, such as a half-tone mask, a slit-pattern mask, a gray-tone mask, a diffraction mask, other similar masks, or a combination thereof may be used to perform patterning. With this type of mask, at least one material layer may be patterned simultaneously. In other works, a plurality of material layers may be patterned simultaneously. For example, a combination of the second patterned conductive layer and the active layer or another material layer may be patterned simultaneously.

The reserved line 208 and the repair line 220 in this embodiment are, for example, but not limited to be, respectively formed by the first patterned conductive layer and the second patterned conductive layer. In another embodiment, the reserved line 208 may be formed by the second patterned conductive layer, and the repair line 220 may be formed by the first patterned conductive layer. In other words, the reserved line 208 is formed by the first patterned conductive layer or the second patterned conductive layer, and the repair line 220 is formed by the other patterned conductive layer. It should be noted that the reserved line 208 and the repair line 220 in this embodiment are located in one pixel structure. In other words, the reserved line 208 and the repair line 220 in this embodiment are located in same pixel structure.

The Second Embodiment

Figure 5A:
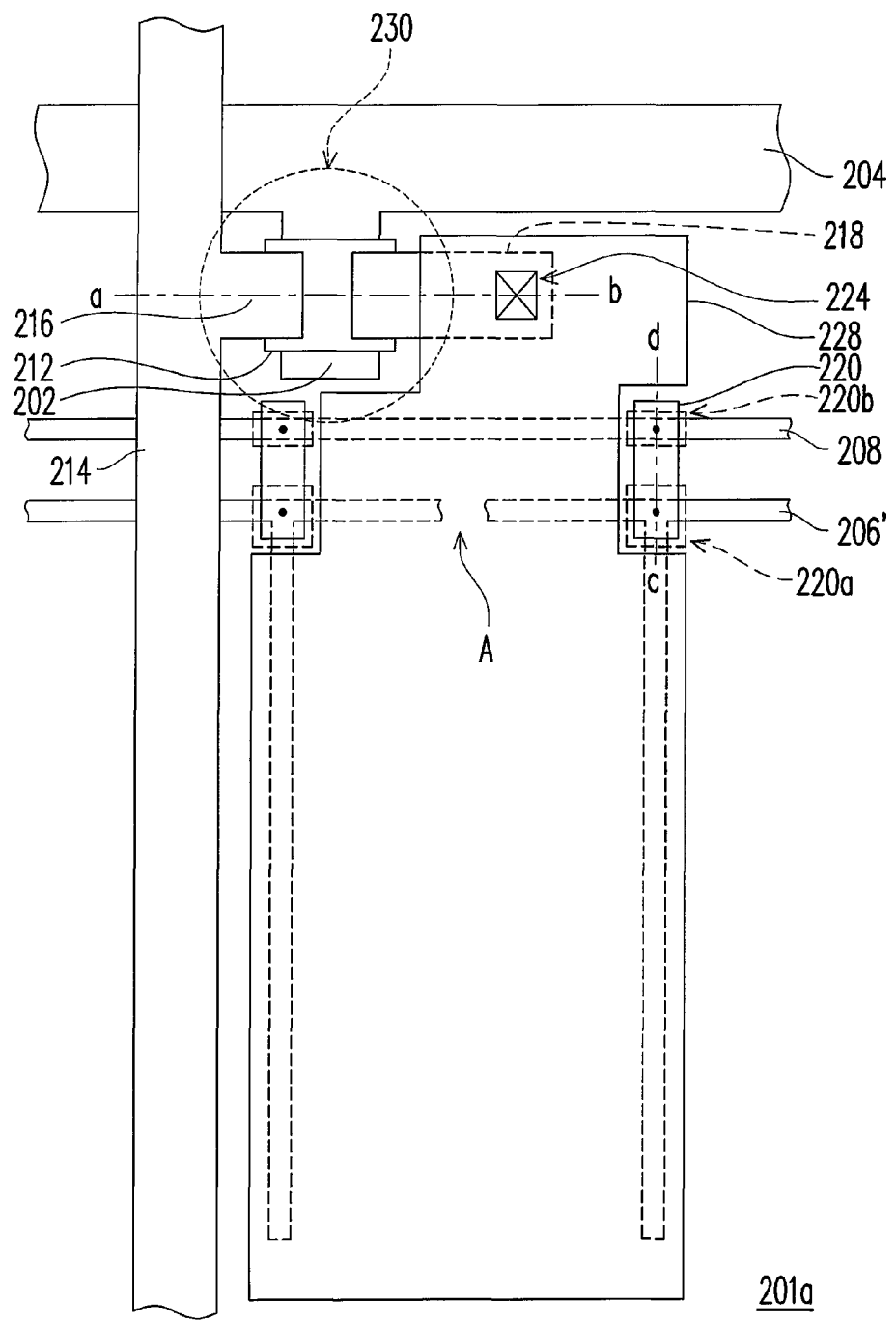
FIG. 5A is a schematic top view of a pixel structure according to a second embodiment of the present invention.
Figure 5B:
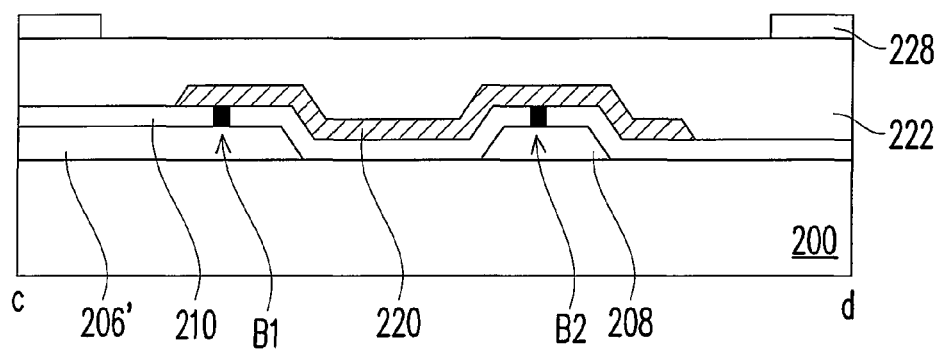
FIGS. 5B and 5C are schematic cross-sectional views taken along a line c-d in FIG. 5A.
Figure 5C:
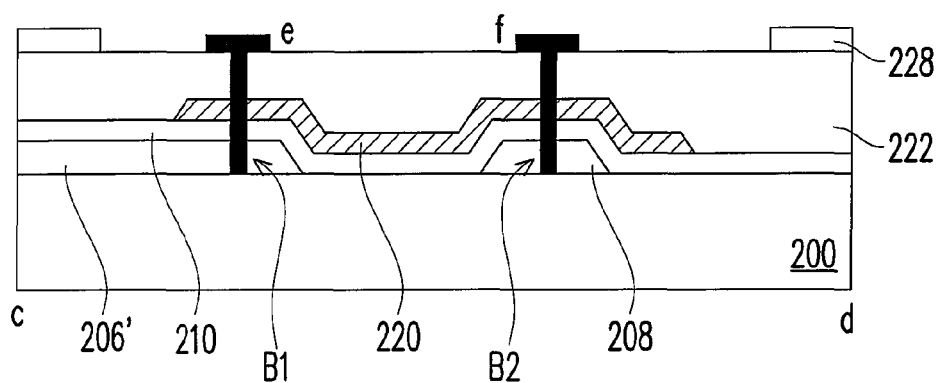

FIG. 5A is a schematic top view of a pixel structure according to a second embodiment of the present invention, and FIGS. 5B and 5C are schematic cross-sectional views taken along a line c-d in FIG. 5A.

Referring to FIGS. 5A and 5B, a pixel structure 201a is fabricated according to the above-mentioned processes, and has, for example, but not limited to be, a similar structure of the pixel structure 201 of the first embodiment in FIG. 2F. However, a common line 206' in the pixel structure 201a has an open-circuit region A, and should be repaired to maintain normal display. In other words, the pixel structure 201a is a repaired pixel structure, and the repairing method thereof is described hereinafter. When the common line 206' has the open-circuit region A caused by particles or other factors in the processes, the method of repairing the pixel structure 201a includes the following steps. The portions of the repair line 220 in the first repairing region 220a and the second repairing region 220b are respectively connected with the common line 206' and the reserved line 208, thereby forming connection positions B1, B2, such that the common line 206', the repair line 220, and the reserved line 208 are connected. Both of the connection positions B1, B2 include at least one connection point. In this embodiment, the connection method is, for example, laser welding. That is, the laser is irradiated on the first repairing region 220a and the second repairing region 220b from the back side of the substrate 200 and/or the front side of the pixel electrode 228, thereby forming the connection positions B1, B2.

Referring to FIG. 5C, in another embodiment, the connection positions B1, B2 may be formed by first using the laser to penetrate the film layers along the same vertical line, for example, to penetrate the passivation layer 222, the repair line 220, the dielectric layer 210, and the common line 206', and the passivation layer 222, the repair line 220, the dielectric layer 210, and the reserved line 208, so as to form through holes in those films. Then, a conductive material is filled in the through holes to form the connection positions B1, B2, such that the repair line 220, the common line 206', and the reserved line 208 are connected. The conductive material is formed by, for example, a laser chemical vapour deposition (laser CVD) process. It should be noted that two end points e, f of the connection positions B1, B2 may be separated or connected with each other, but the connection positions B1, B2 are not connected with the pixel electrode 228. Moreover, when using the laser to perform penetrating (laser cutting), the tolerance of the control of the laser energy is large, so as to save the time spent for fine tune. Therefore, the repairing efficiency can be improved.

Although the common line 206' in the pixel structure 201a has the open-circuit region A, the common line 206', the repair line 220, and the reserved line 208 are connected at connection positions B1, B2, and thus the pixel structure 201a can maintain normal display. In other words, the signal originally transmitted through the common line 206' may be transmitted by the common line 206', the repair line 220, and the reserved line 208 through the connection positions B1, B2 to remove the open-circuit region A effect.

The Third Embodiment

Figure 6A:
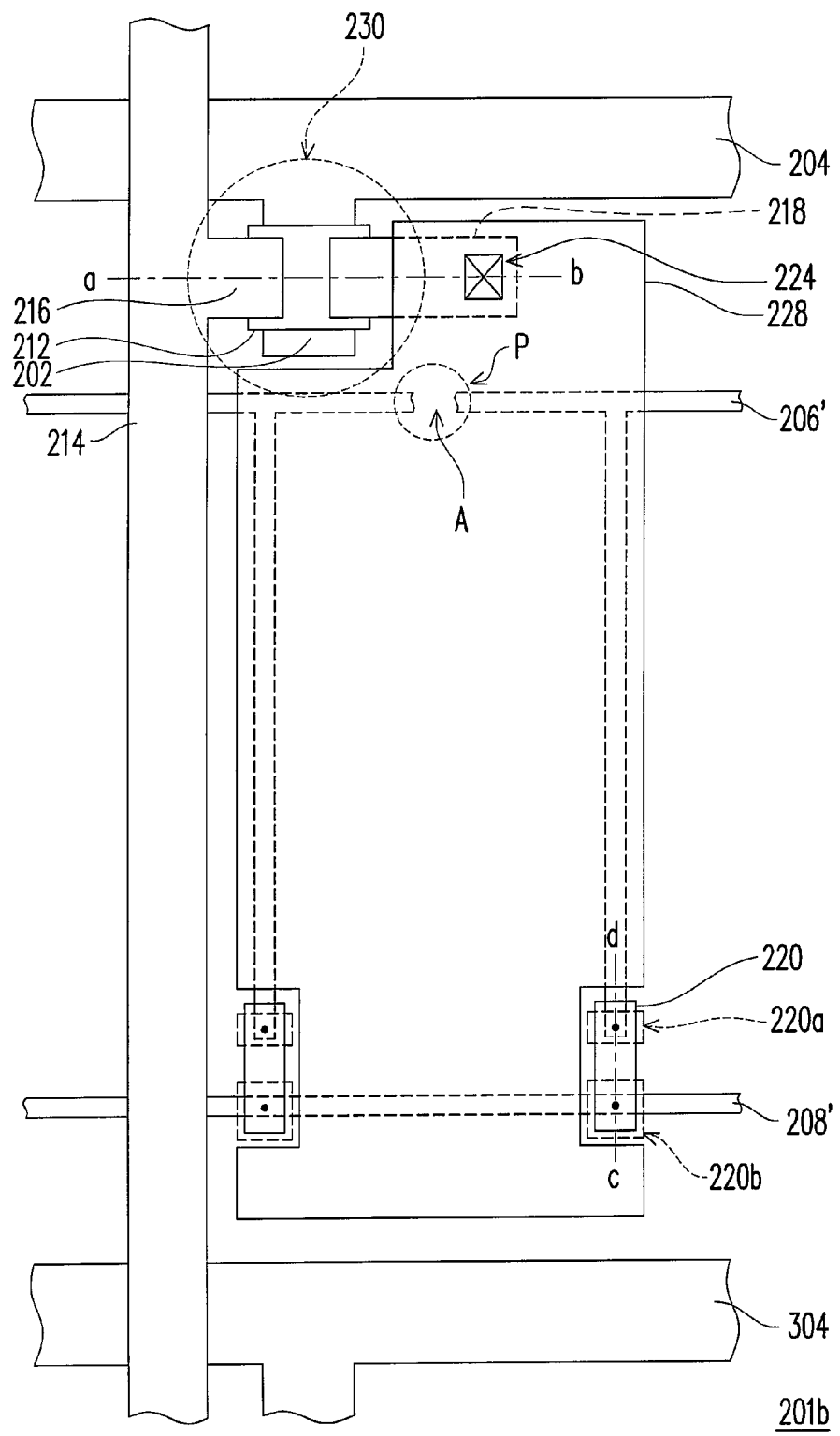
FIG. 6A is a schematic top view of a pixel structure according to a third embodiment of the present invention.
Figure 6B:
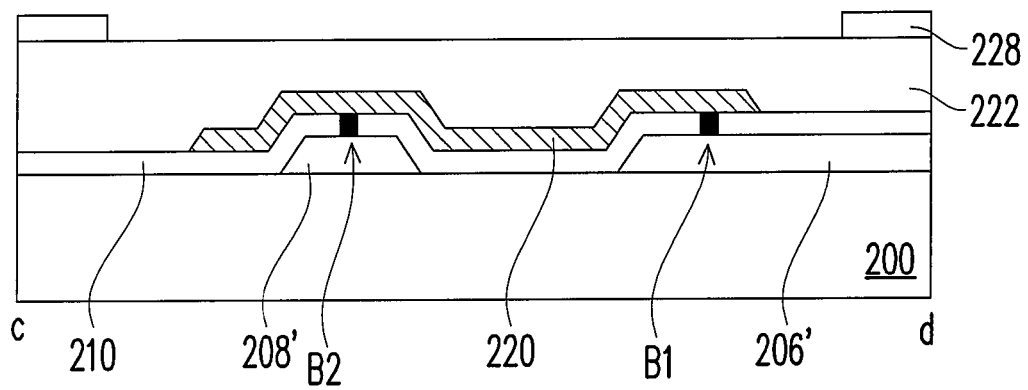
FIGS. 6B and 6C are schematic cross-sectional views taken along a line c-d in FIG. 6A.
Figure 6C:
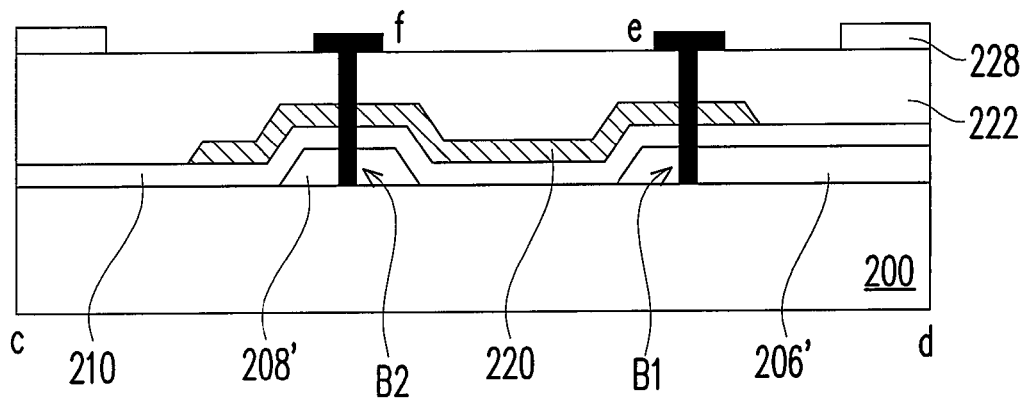

FIG. 6A is a schematic top view of a pixel structure according to a third embodiment of the present invention, and FIGS. 6B and 6C are schematic cross-sectional views taken along a line c-d in FIG. 6A.

Referring to FIGS. 6A and 6B, a pixel structure 201b is similar to the pixel structure 201a in FIG. 5A. In other words, the pixel structure 201b is also a pixel structure that has been repaired since the common line 206' is open. However, in this embodiment, the common line 206' is, for example, disposed between the scan line 204 and a reserved line 208'. In other words, the reserved line 208' is disposed near a corresponding scan line 304 of a next pixel structure (not shown). Therefore, for example, when large particles P near the common line 206' causes the open-circuit region A of the common line 206' occurring, the reserved line 208' far away from the common line 206' will not be influenced by the particles P. Therefore, the repairing method of the second embodiment may be used to repair the pixel structure 201b. That is, the portions of the repair line 220 in the first repairing region 220a and the second repairing region 220b are respectively connected with the common line 206' and the reserved line 208', so as to form the connection positions B1, B2, such that the common line 206', the repair line 220, and the reserved line 208' are connected. In this embodiment, the connection method is, for example, laser welding. That is, the laser is irradiated on the first repairing region 220a and the second repairing region 220b from the back side of the substrate 200 and/or the front side of the pixel electrode 228, thereby forming the connection positions B1, B2.

Referring to FIG. 6C, in another embodiment, the connection positions B1, B2 may be formed by first using the laser to penetrate the film layers along the same vertical line, for example, to penetrate the passivation layer 222, the repair line 220, the dielectric layer 210, and the common line 206', and the passivation layer 222, the repair line 220, the dielectric layer 210, and the reserved line 208', so as to form through holes in those films. Then, a conductive material is filled in the through holes to form the connection positions B1, B2, such that the repair line 220, the common line 206', and the reserved line 208' are connected. The conductive material is formed by, for example, a laser chemical vapor deposition process. It should be noted that two end points e, f of the B1, B2 may be separated or connected with each other, but the connection positions B1, B2 are not connected with the pixel electrode 228. Moreover, when using the laser to perform penetrating (laser cutting), the tolerance of the control of the laser energy is large, so as to save the time spent for fine tune. Therefore, the repairing efficiency can be improved.

Although the common line 206' in the pixel structure 201b has the open-circuit region A, the common line 206', the repair line 220, and the reserved line 208' are connected at the connection positions B1, B2, and thus the pixel structure 201b can maintain normal display. In other words, the signal originally transmitted through the common line 206' may be transmitted by the common line 206', the repair line 220, and the reserved line 208' through the connection positions B1, B2 to remove the open-circuit region A effect.

The Fourth Embodiment

Figure 7A:
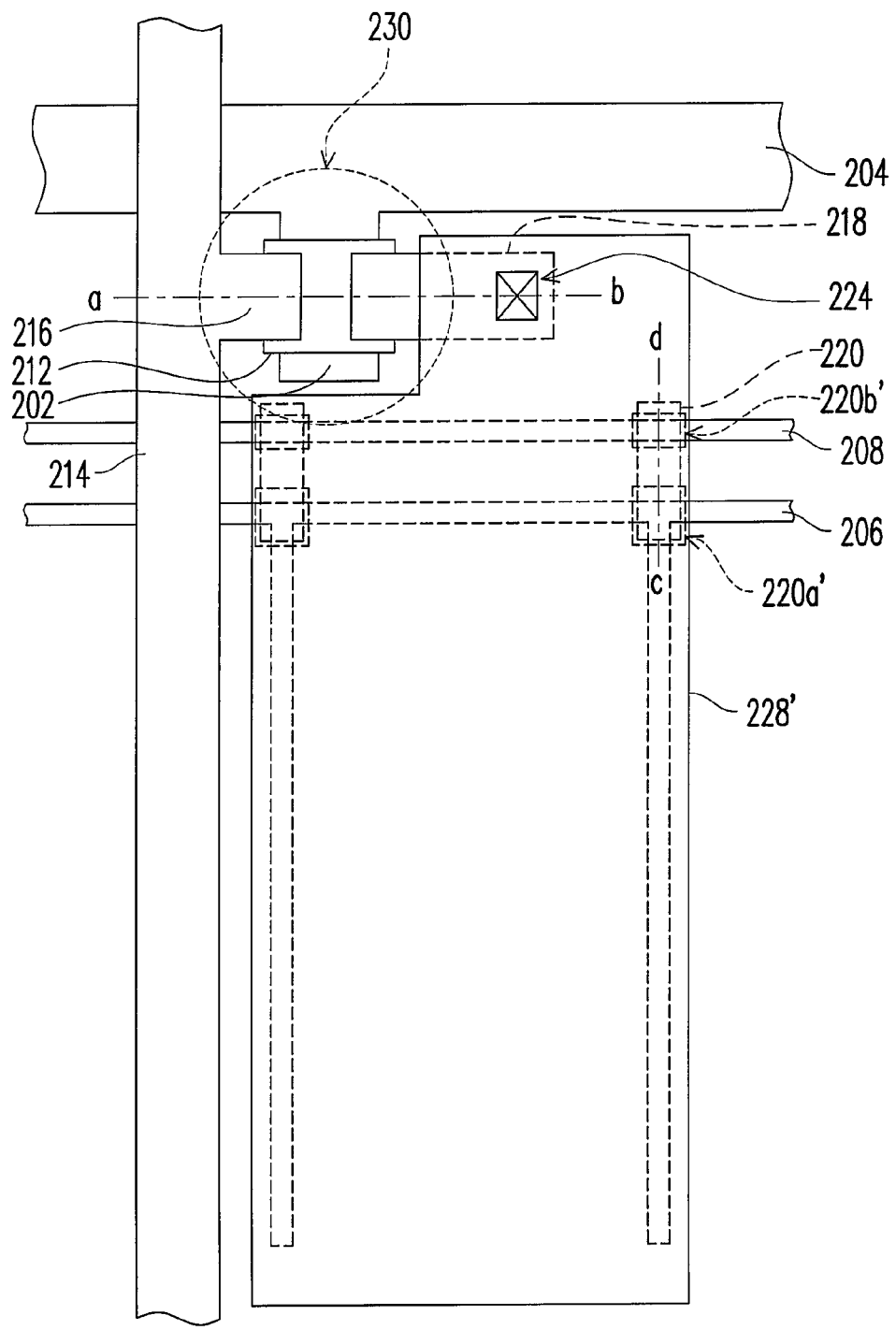
FIG. 7A is a schematic top view of a pixel structure according to a fourth embodiment of the present invention.
Figure 7B:
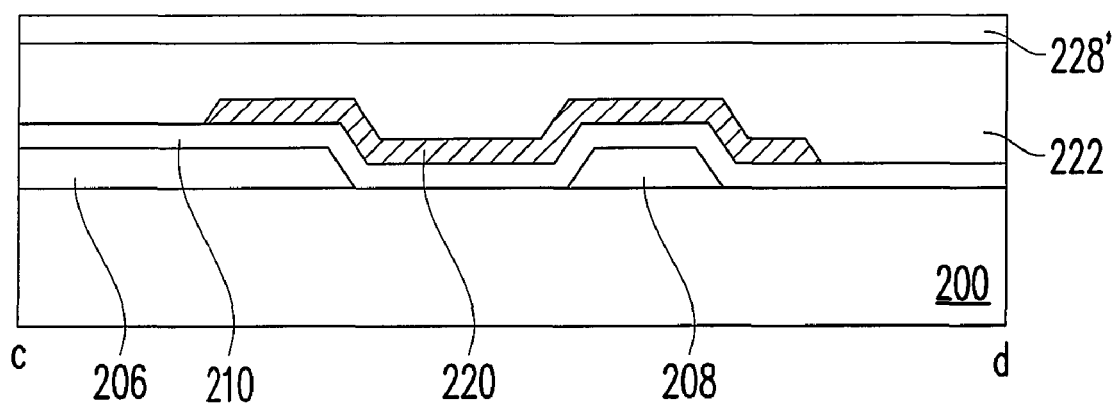
FIG. 7B is a schematic cross-sectional view taken along a line c-d in FIG. 7A.
Figure 7C:
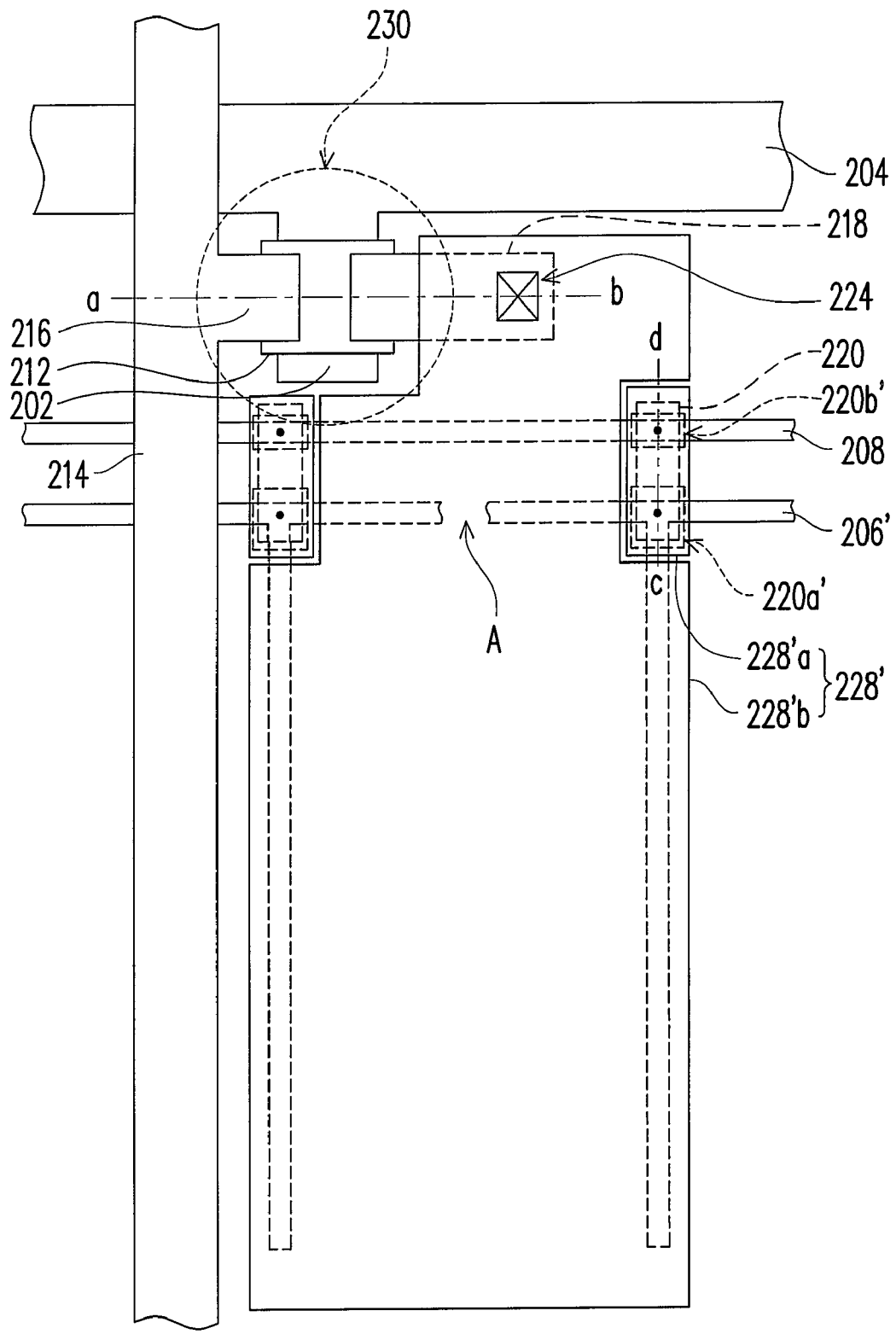
FIG. 7C is a schematic top view of the pixel structure in FIG. 7A after being repaired.

FIG. 7A is a schematic top view of a pixel structure according to a fourth embodiment of the present invention, and FIGS. 7B and 7C are schematic cross-sectional views taken along a line c-d in FIG. 7A. FIG. 7C is a schematic top view of the pixel structure in FIG. 7A after repairing, and FIG. 7D and FIG. 7E are schematic cross-sectional views taken along a line c-d in FIG. 7C.

Referring to FIGS. 7A and 7B, the pixel structure 201c is fabricated according to the processes in the first embodiment, and has a similar structure of the pixel structure 201 in FIG. 2F. However, in this embodiment, a first repairing region 220a' and a second repairing region 220b' are covered by a pixel electrode 228'. Therefore, when the common line 206 is open, the repairing method thereof is different from the above repairing method.

Figure 7D:
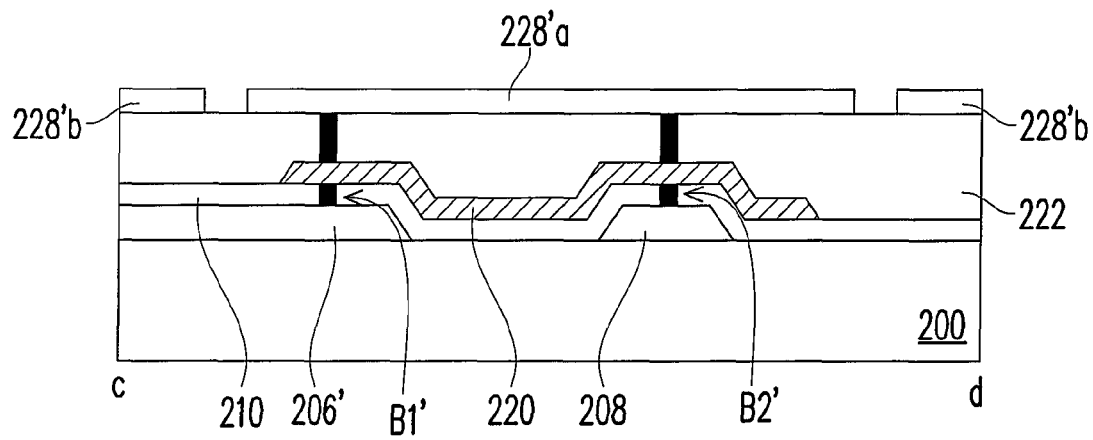
FIGS. 7D and 7E are schematic cross-sectional views taken along a line c-d in FIG. 7C.

Referring to FIGS. 7C and 7D, when the common line 206' has an open-circuit region A caused by particles or other factors in the processes, the repairing method of a pixel structure 201c' includes the following steps. First, the pixel electrode 228' is separated into a first block 228'a and a second block 228'b electrically insulated from the first block 228'a. The method of separating the pixel electrode 228' is, for example, laser cutting. Thereafter, the first block 228'a, the repair line 220 in the first repairing region 220a', and the common line 206' are connected, so as to form a connection position B1'. Then, the first block 228'a, the repair line 220 in the second repairing region 220b', and the reserved line 208 are connected, so as to form a connection position B2'. In this embodiment, the connection method is, for example, laser welding. That is, the laser is irradiated on the first repairing region 220a' and the second repairing region 220b' from the back side of the substrate 200 and/or the front side of the pixel electrode 228', thereby forming the connection positions B1' and B2'.

Figure 7E:
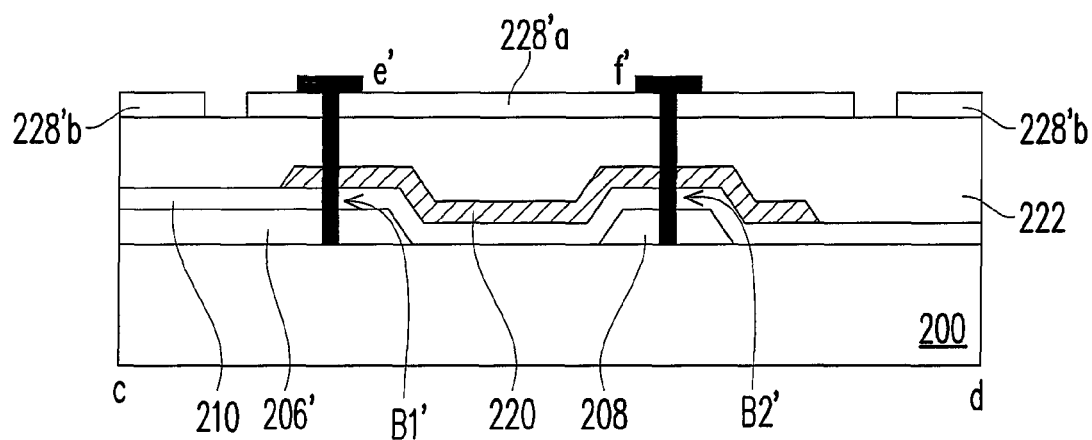

Referring to FIG. 7E, in another embodiment, the connection positions B1, B2 may be formed by using the laser to penetrate the film layers along the same vertical line, for example, to penetrate the first block 228'a, the passivation layer 222, the repair line 220, the dielectric layer 210, and the common line 206', and the first block 228'a, the passivation layer 222, the repair line 220, the dielectric layer 210, and the reserved line 208, so as to form through holes in those films. Then, a conductive material is filled in the through holes to form the connection positions B1', B2', such that the repair line 220, the common line 206', and the reserved line 208 are connected electrically. The conductive material is formed by, for example, a laser chemical vapor deposition. It should be noted that two end points e', f' of the positions B1', B2' may be separated or connected, but the connection positions B1', B2' are not connected with the second block 228'b. Moreover, when using the laser to perform penetrating, the tolerance of the control of the laser energy is large, so as to save the time spent for fine tune. Therefore, the repairing efficiency can be improved.

Since the common line 206', the repair line 220, and the reserved line 208 are connected, the repairing of the pixel structure 201c' is completed. On the other hand, the separating of the first block 228'a has a less significant effect on the whole pixel electrode 228', and thus the pixel structure 201c' can maintain normal display. In other words, the signal originally transmitted through the common line 206' may be transmitted by the common line 206', the repair line 220, and the reserved line 208 through the connection positions B1', B2' to remove the open-circuit region A effect.

Figure 8:
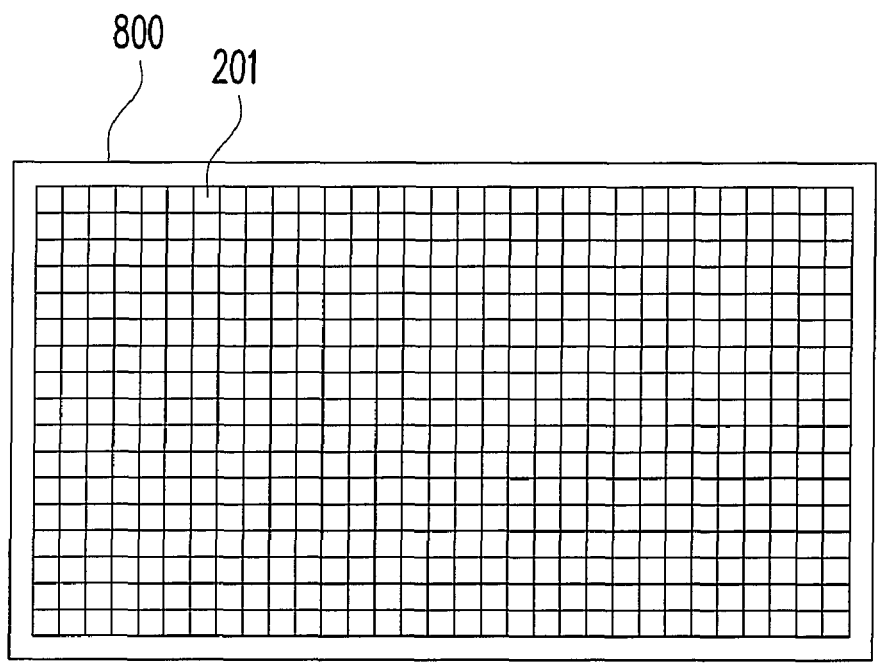
FIG. 8 is a schematic view of a display panel.

Moreover, the pixel structure 201 of the above-mentioned embodiment is applicable to the fabrication of a display panel, and FIG. 8 is a schematic view of the display panel. A display panel 800 includes, but not limited to, a first transparent substrate (not shown) having pixel structures 201 arranged in an array, a second transparent substrate (not shown) opposite to the first transparent substrate, and a display media material (not shown) disposed between the first transparent substrate and the second transparent substrate. The second transparent substrate may be has a transparent conductive layer. The type of the display media material will influence the type of the display panel. For example, when the display media material is a liquid crystal material, the display panel 800 is referred to as a liquid crystal display panel, for example, a transmissive display panel, a semi-transmissive display panel, a reflective display panel, a color filter on array (COA) display panel, an array on color filter (AOC) display panel, a vertical alignment (VA) display panel, an in-plane switching (IPS) display panel, a multi-domain vertical alignment (MVA) display panel, a twisted nematic (TN) display panel, a super twisted nematic (STN) display panel, a pattern vertical alignment (PVA) display panel, a super pattern vertical alignment (S-PVA) display panel, an advance super view (ASV) display panel, a fringe-field switching (FFS) display panel, a continuous pinwheel alignment (CPA) display panel, an axially symmetric aligned microcell (ASM) display panel, an optically compensated bend (OCB) display panel, a super in-plane switching (S-IPS) display panel, an advanced-super in-plane switching (AS-IPS) display panel, an ultra fringe-field switching (UFFS) display panel, a polymer stable alignment display panel, a dual-view display panel, a triple-view display panel, a three-dimensional display panel, a dual display panel, another type of panel, or a combination thereof. When the display media material is an organic electroluminescent material, for example, a small molecular light-emitting material, a polymer light-emitting material, or a combination thereof, the display panel 800 is referred to as an organic electroluminescent display panel, and the type of the panel is, for example, a fluorescent organic electroluminescent display panel, a phosphorescent organic electroluminescent display panel, or a combination thereof. When the display media material is the organic electroluminescent material and the liquid crystal material, the display panel 800 is referred to as a hybrid panel.

Figure 9:
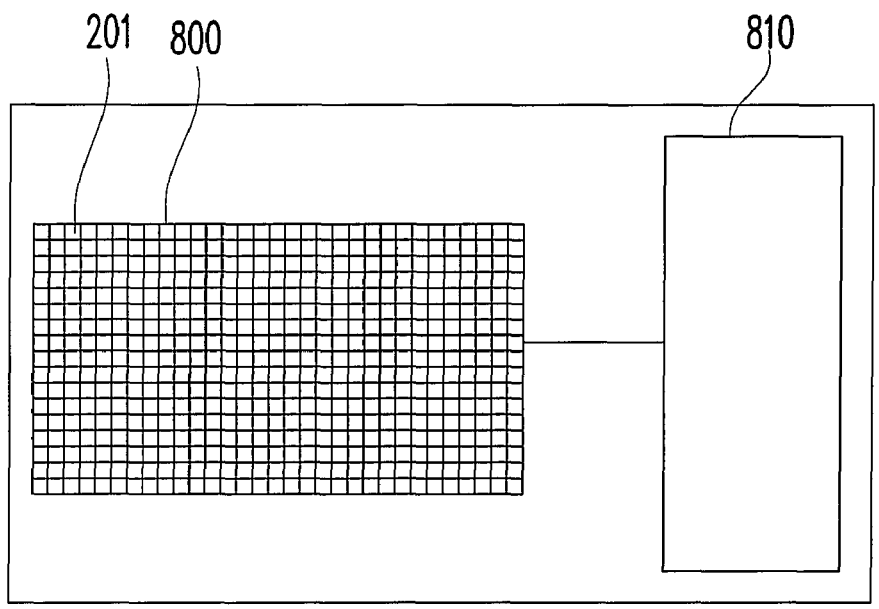
FIG. 9 is a schematic view of an electro-optical apparatus.

Further, FIG. 9 is a schematic view of an electro-optical apparatus. The display panel 800 formed by the pixel structures 201 arranged in an array may be combined with an electronic device 810 to form the electro-optical apparatus 900. The electronic device 810 is, for example, a controlling device, an operating device, a processing device, an inputting device, a memory device, a driving device, a light-emitting device, a protective device, a sensing device, a detecting device, another functional device, or a combination thereof. Therefore, the type of the electro-optical apparatus 900 includes a portable product (e.g., a mobile phone, a video camera, a camera, a notebook, a game machine, a watch, a music player, an email transceiver, a map navigator, a digital picture, or the like), an audio-visual product (e.g., an audio-visual player or the like), a screen, a television, a bulletin board, or a panel in a projector, or the like.

In view of the above, the pixel structure of the present invention has the reserved line and the repair line. Thus, when the common line is open, the defect of the open circuit may be quickly repaired only by connecting the common line, the repair line and the reserved line, such that the pixel structure can still display normally, thereby improving the yield rate of the display.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate and electrically connected with a scan line and a data line, comprising:
   a common line disposed on the substrate;
   a reserved line disposed on the substrate and electrically insulated from the common line;
   a dielectric layer disposed on the substrate and covering the common line and the reserved line;
   two repair lines disposed on the dielectric layer, each of the repair lines comprising a first repairing region overlapped with the common line and a second repairing region overlapped with the reserved line;
   an active device disposed on the substrate and electrically connected with the scan line and the data line; and
   a pixel electrode disposed above the dielectric layer and electrically connected with the active device.

2. The pixel structure according to claim 1, further comprising a passivation layer disposed on the substrate to cover the scan line, the data line, the active device, the common line, the reserved line, the dielectric layer, and the repair line, so that the pixel electrode is disposed on the passivation layer.

3. The pixel structure according to claim 1, wherein the pixel electrode is disposed without covering the first repairing regions and the second repairing regions.

4. The pixel structure according to claim 1, wherein the common line and the reserved line are made of a same material.

5. The pixel structure according to claim 1, wherein the reserved line is disposed between the scan line and the common line.

6. The pixel structure according to claim 1, wherein the common line is disposed between the scan line and the reserved line.

7. The pixel structure according to claim 1, wherein the common line is substantially in a π shape.

8. The pixel structure according to claim 1, wherein the common line comprises an open-circuit region.

9. The pixel structure according to claim 1, wherein the first repairing regions and the second repairing regions respectively comprise at least one connection point, such that the first repairing regions and the second repairing regions are connected with the common line and the reserved line, respectively.

10. A display panel, comprising the pixel structure according to claim 1.

11. An electro-optical apparatus, comprising the display panel according to claim 10.

12. A method for repairing the pixel structure according to claim 3, when the common line is open, the repairing method comprising:
connecting the repair lines with the common line in the first repairing regions and connecting the repair lines with the reserved line in the second repairing regions.

13. A method for repairing the pixel structure according to claim 1, when the common line is open, the repairing method comprising:
separating the pixel electrode into two first blocks and one second block electrically insulated from the first blocks;
connecting the first blocks, the repair lines in the first repairing regions, and the common line; and
connecting the first blocks, the repair lines in the second repairing regions, and the reserved line.

14. A method of fabricating a pixel structure, comprising:
forming a gate, a scan line, a common line, and a reserved line on a substrate, wherein the gate is electrically connected with the scan line;
forming a dielectric layer on the substrate to cover the gate, the scan line, the common line, and the reserved line;
forming a channel layer on the dielectric layer;
forming a source, a drain, and a data line on the dielectric layer, wherein the source and the drain cover a portion of the channel layer above two sides of the gate, and the source is electrically connected with the data line, such that the gate, the channel layer, the source, and the drain as an active device;
forming two repair lines on the dielectric layer, wherein each of the repair lines comprises a first repairing region overlapped with the common line and a second repairing region overlapped with the reserved line; and
forming a pixel electrode on the substrate, so that the pixel electrode is electrically connected with the drain.

15. The method of a pixel structure according to claim 14, further comprising forming a passivation layer on the substrate to cover the scan line, the data line, the active device, the common line, the reserved line, the dielectric layer, and the repair lines, such that the pixel electrode is formed on the passivation layer.

16. The method of a pixel structure according to claim 15, further comprising forming a contact opening in the passivation layer to expose a portion of the drain, so that the pixel electrode is electrically connected with the drain through the contact opening.

17. The method of a pixel structure according to claim 14, further comprising forming at least one connection point on the first repairing regions and the second repairing regions, such that the first repairing regions and the second repairing regions are connected with the common line and the reserved line, respectively.

18. A method of fabricating a display panel, comprising the method of fabricating a pixel structure according to claim 14.

19. A method of fabricating an electro-optical apparatus, comprising the method of fabricating a display panel according to claim 18.

20. A method of repairing a display panel, comprising the method of repairing a pixel structure according to claim 12.

21. A method of repairing a display panel, comprising the method of repairing a pixel structure according to claim 13.

22. A method of repairing an electro-optical apparatus, comprising the method of repairing a display panel according to claim 20.

23. A method of repairing an electro-optical apparatus, comprising the method of repairing a display panel according to claim 21.

* * * * *